United States Patent

Sakurai

[11] Patent Number: 5,895,931
[45] Date of Patent: Apr. 20, 1999

[54] SEMICONDUCTOR DEVICE

[75] Inventor: Nobuhiro Sakurai, Wako, Japan

[73] Assignee: Honda Giken Kogyo Kabushiki Kaisha, Tokyo, Japan

[21] Appl. No.: 08/861,886

[22] Filed: May 22, 1997

Related U.S. Application Data

[63] Continuation of application No. 08/561,715, Nov. 22, 1995, abandoned.

[30] Foreign Application Priority Data

Nov. 24, 1994 [JP] Japan .................................. 6-290200

[51] Int. Cl.$^6$ ...................... H01L 29/06; H01L 31/0328; H01L 31/0336; H01L 31/072
[52] U.S. Cl. .................................. 257/29; 257/194
[58] Field of Search ...................... 251/192, 194; 257/194, 29

[56] References Cited

U.S. PATENT DOCUMENTS 4,721,983  1/1988  Frazier .
5,414,274  5/1995  Goronkin et al. .

FOREIGN PATENT DOCUMENTS 6-21435  1/1994  Japan .

OTHER PUBLICATIONS

Proc. IRE 48, 1960, p. 359.

Physical Review Letter -6, 1961, p. 341.

Proc. IEEE 61, 1973, p. 1053.

Appl. Plys. Lett. 64, Feb. 28, 1994, p. 1138.

Japanese Journal of Applied Physics, vol. 24, No. 10, Oct. 1985, pp. L835–L837.

*Primary Examiner*—Stephen D. Meier
*Attorney, Agent, or Firm*—Lyon & Lyon LLP

[57] ABSTRACT

A barrier layer (AlAs) is formed on a source layer (n-GaAs), and a drain layer (n-GaAs) and a gate layer (p-GaAs) adjacent to the drain layer are formed on the barrier layer. If the drain layer is biased to a plus voltage with the source layer, then a tunneling current will flow by way of the barrier layer. By applying a voltage to the gate layer so that the p-n junction is biased in the reverse direction, the potential on the gate side of the channel rises and the tunneling current decreases. Also, the channel width decreases due to the spread of the depletion layer to the channel side, and consequently, the current of the drain layer decreases. Thus, based on the voltage applied to the gate layer, the drain current can be controlled.

11 Claims, 4 Drawing Sheets

(a)

(b)

(c)

(a)

(b)

(c)

SEMICONDUCTOR DEVICE

This is a continuation of application Ser. No. 08/561,715, filed on Nov. 22, 1997 and which designated the U.S. now abandoned.

BACKGROUND OF THE INVENTION

1. Field of the Invention

The present invention relates to a semiconductor device to which a new principle of operation is applied employing the tunneling effect.

2. Description of the Related Art

As tunnel transistors employing the tunneling effect, an MIMIM structure (M: metal; I: insulator) was first proposed by Mead (Proc. IRE 48 (1960) 359). Thereafter, an MIMS structure (S: semiconductor) (Phys. Rev. Lett 6 (1961) 341) was proposed by Spratt et al. and an MIS structure (Proc. IEEE 61 (1973) 1053) by Kisaki et al. These structures have been provided as semiconductor devices in which hot electrons are employed to achieve high-speed operation and are now generally referred to as hot electron transistors (HETs).

The principles of operation of the HET comprised of the semiconductor heterojunction will hereinafter be described. HET has a semiconductor heterojunction such as the one shown in FIG. 6 and is based on the operational principle which, if a ratio of the base current and the collector current is $\beta$ and the base-collector voltage can be increased to more than $1/\beta$ of the emitter-base voltage, an electrical power can be amplified.

To obtain a practical HET device, there are a large number of problems to be solved, as follows:

(1) Since the reflection at the collector barrier is great, there is a loss due to the base current.

(2) In some transistors (e.g., Japanese Patent Laid-Open Publication HEI 6-21435), the potential shape has been improved in order to reduce reflection at the collector barrier, but the epitaxial process is complicated.

(3) Manufacture of a very thin base and of a contact with respect to the base is difficult.

Because of the problems as described above, the amplification factor, which can be obtained with the currently reported HET, is very low. There is a THETA (Appl. Phys. Lett 64 (1994) 1138) as a HET device of the semiconductor heterojunction having a single barrier on an emitter for improvement of an amplification factor, but the aforementioned base-contact problem remains. In addition, an RHET (Jpn. J. Appl. Phys. 24 (1985) L 825) using the heterojunction double-barrier resonance tunneling effect is satisfactory in a limited use such as a switching element, but it is unsuited to a wide application such as signal amplification.

SUMMARY OF THE INVENTION

It is an object of this invention to provide a semiconductor device based on new principles of operation, which is rendered capable of making use of hot electrons for achieving high-speed operation.

Another object of the invention is to provide a semiconductor device based on new principles of operation, in which there is no collector reflection at a collector barrier, unlike in a HET.

Still another object of the invention is to provide a semiconductor device based on new principles of operation, which is simple in construction and in which a contact (electrode) can be formed easily.

To achieve the above objects, there is provided according to the present invention a semiconductor device comprising a first semiconductor layer, a barrier layer provided on the first semiconductor layer, a second semiconductor layer provided on the barrier layer, and a gate layer provided on the barrier layer adjacent to the second semiconductor layer.

If the second semiconductor layer is biased to a plus voltage with the first semiconductor layer, then the tunneling current will flow via the barrier layer. By applying a voltage to the gate layer so that the p-n junction is biased in the reverse direction, the potential on the gate side of the channel rises and the tunneling current decreases. Also, the channel width decreases due to the spread of the depletion layer to the channel side, and consequently, the current of the second semiconductor layer decreases. Thus, based on the voltage applied to the gate layer, the current, which flows from the first semiconductor layer to the second semiconductor layer, can be controlled.

Since hot electrons are utilized, a high-speed operation is possible. In addition, since the semiconductor device is structurally simple, formation of a contact (electrode) is easy.

BRIEF DESCRIPTION OF THE ACCOMPANYING DRAWINGS

The above and other objects and advantages of the present invention will become apparent from the following detailed description when read in conjunction with the accompanying drawings, in which.

DETAILED DESCRIPTION

A preferred embodiment of the present invention will hereinafter be described in detail having reference to the accompanying drawings.

Figure 1:
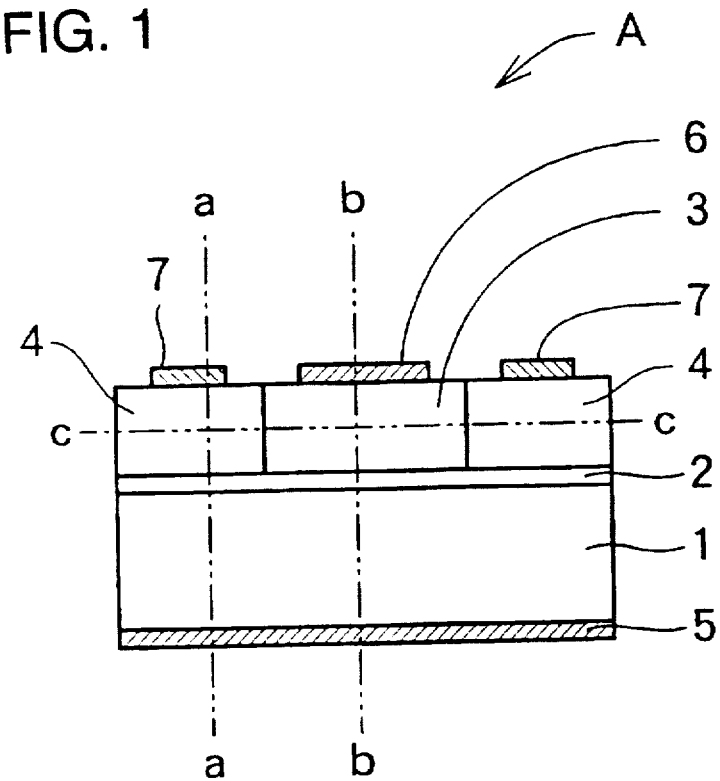
FIG. 1 is a schematic sectional view showing a semiconductor device according to a first embodiment of this invention.

Reference is initially taken to FIG. 1, which is a schematic sectional view of a semiconductor device according to a first embodiment of this invention.

In FIG. 1, the semiconductor device according to the first embodiment is generally designated by reference character A. A barrier layer 2 is formed on a source 1 which is a first semiconductor layer. On the barrier layer 2, there is formed a drain 3 which is a second semiconductor layer, and on the barrier layer 2, a gate layer 4 is formed adjacent the drain 3. A source electrode 5 is formed on the under surface of the source 1. A drain electrode 6 is formed on the upper surface of the drain 3. Gate electrodes 7 are formed on the upper surface of the gate layer 4.

The source 1 is composed of, for example, n-GaAs. The barrier layer 2 which is a tunnel barrier wall is composed of, for example, AlAs. The drain 3 is composed of, for example, n-GaAs. The gate layer 4 is composed of, for example, p-GaAs.

Figure 2:
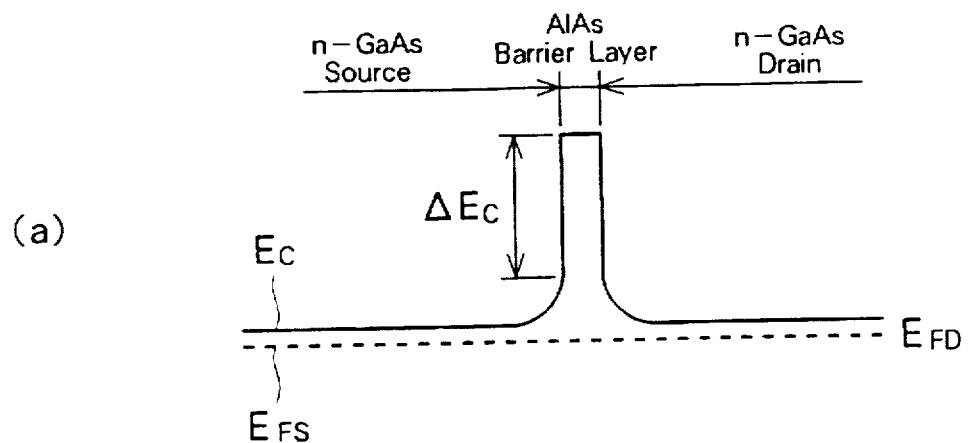
FIG. 2 is a potential diagram showing the equilibrium state of the semiconductor device shown in FIG. 1.
Figure 2:
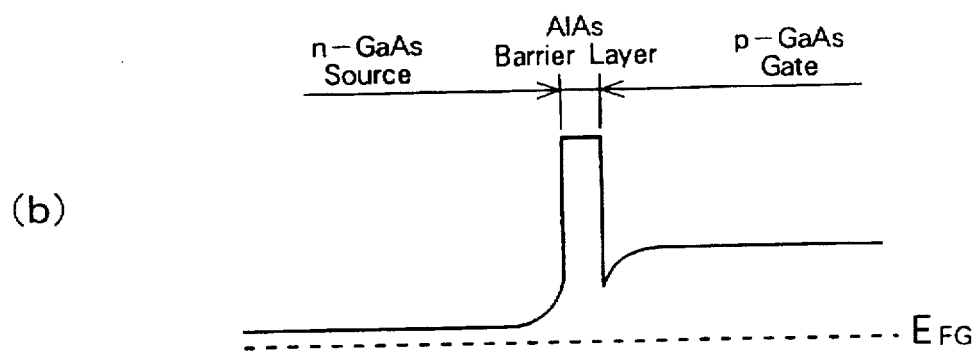
Figure 2:
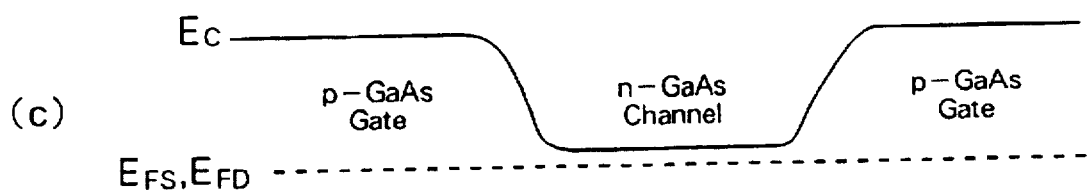
Figure 3:
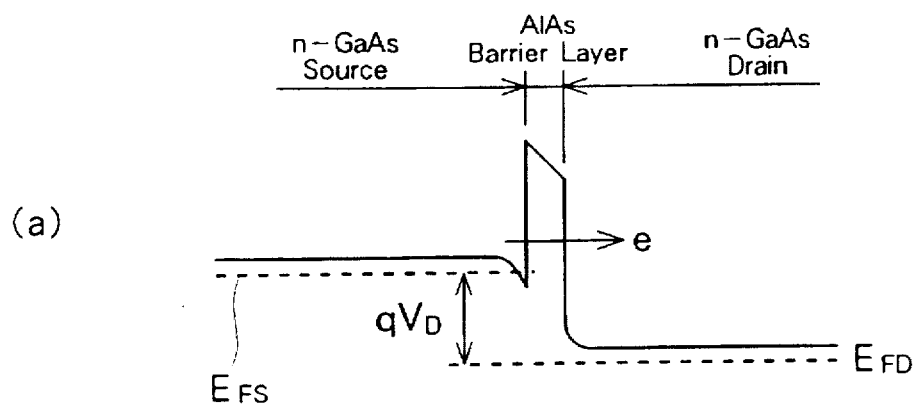
FIG. 3 is a potential diagram as a drain and a gate bias voltage are added to the semiconductor device shown in FIG. 1.
Figure 3:
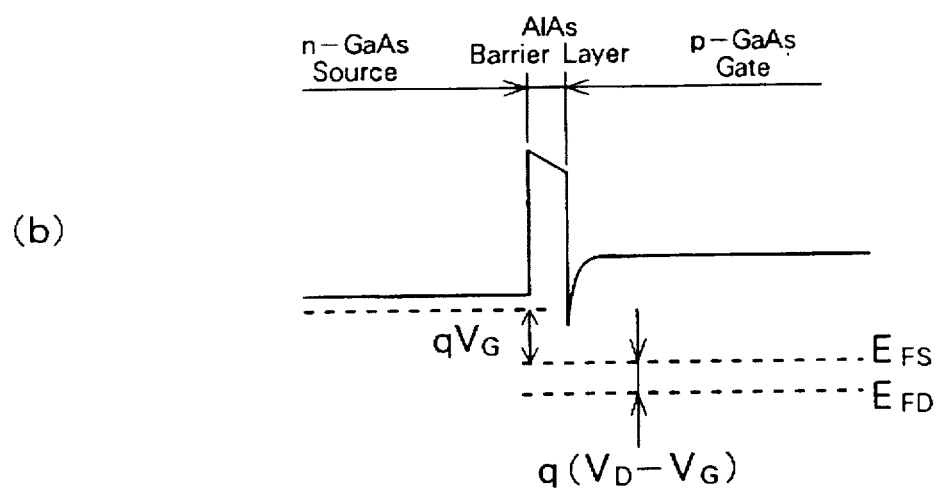
Figure 3:
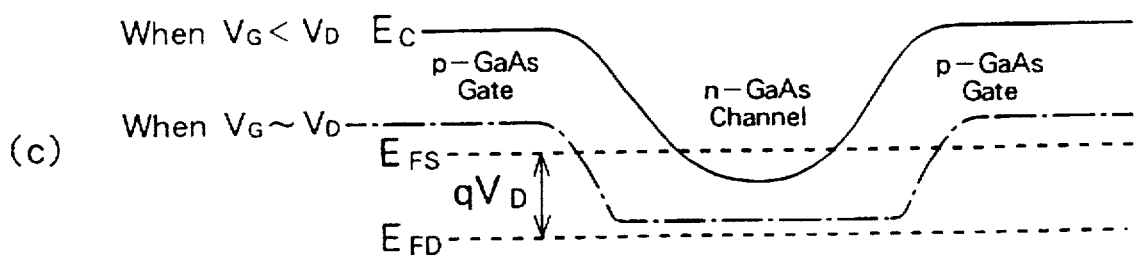

The potential diagram of the conduction band of the channel and gate regions at the equilibrium state is shown in FIG. 2, and the potential diagram as the drain and the gate bias voltage are added is shown in FIG. 3. In FIGS. 2 and 3, (a) shows the potential of a channel region (Indicated by line a—a in FIG. 1), (b) shows the potential of a gate region (indicated by line b—b in FIG. 1), and (c) shows the potential of a channel-drain region (indicated by line c—c in FIG. 1).

In the semiconductor device shown in FIG. 1, for example, if the drain is biased to a plus voltage with respect to the source potential, then a tunneling current will flow. At this time, by applying a voltage to the gate so that the p-n junction is biased in the reverse direction, the potential on the gate side of the channel rises and the tunneling current decreases. In addition, the channel width decreases due to the spread of the depletion layer to the channel side, and consequently, the drain current decreases.

Thus, the semiconductor device of this embodiment differs from the HET in that the current can be controlled by the gate. In addition, although the gate structure is similar to a known junction filed-effect transistor (JFET), the JFET entirely differs from the present invention based on the control of the tunneling current, because the principles of operation of the JFET are the current control where the width of a channel, which comprises a conduction band where electrons move, is controlled by the gate voltage.

In FIGS. 2 and 3, $E_c$ is the conduction band end, $\Delta E_c$ is the conduction band discontinuity, $E_{FS}$ is the Fermi level on the source side, $E_{FD}$ is the Fermi level on the drain side, $E_{FG}$ is the gate Fermi level, $V_D$ is the applied voltage of the drain, and $V_G$ is the applied voltage of the gate.

The band structure (such as the bandgap between the source 1, the barrier 2, the drain 3, and the gate layer 4, the shape of variation of the bandgap, and the quantity of the band discontinuity) and the band material are not limited to those of the embodiment. Various device characteristics can be designed by changing each layer to a graded potential structure or using different materials of different heterojunction types.

For example, each region of the source 1 and the drain 3 may be a heterojunction between the aforementioned n-GaAs and a III-V compound semiconductor such as InP, a II-VI compound semiconductor such as ZnSe, a IV-IV compound semiconductor such as SiGe, or a IV compound semiconductor such as Ge, or may be a heterojunction having a graded potential of those semiconductors.

The barrier layer 2, which is the tunnel barrier wall, may be a heterojunction between the aforementioned AlAs and a very thin wide gap semiconductor such as a III-V compound semiconductor like AlP, a II-VI compound semiconductor like ZnSe, or a IV-IV compound semiconductor like SiC, or may be a heterojunction having a graded potential of those semiconductors. In addition, these semiconductors may be doped depending upon their objects, or may be a very thin insulator like $SiO_2$.

Figure 4:
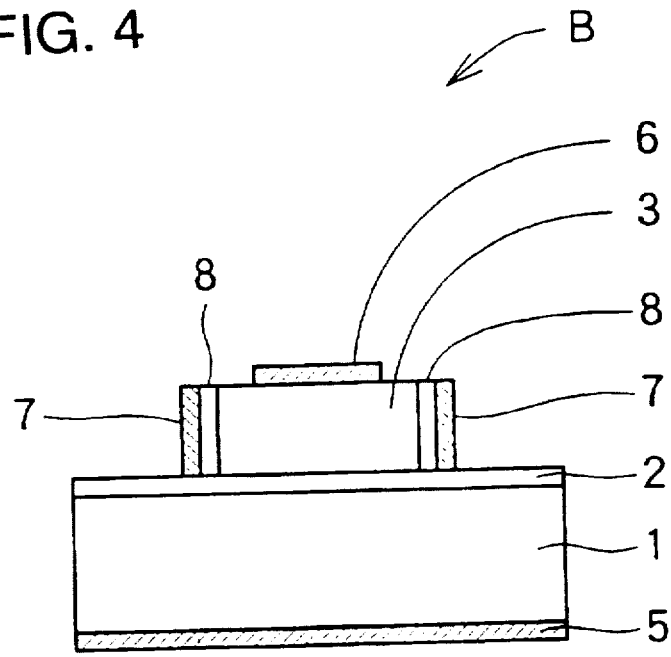
FIG. 4 is a schematic sectional view showing a semiconductor device according to a second embodiment of this invention.

The gate layer 4 may be a p-n junction gate of a homojunction or heterojunction between the aforementioned p-GaAs and another semiconductor, or may be an insulated gate where a gate insulating film 8 is formed on the side wall of a drain 3 which is a second semiconductor layer, like a semiconductor device B shown in FIG. 4, and may be a Schottky junction gate.

The semiconductor device shown in FIG. 1 is manufactured as follows. For example, the AlAs barrier layer 2 and the n-GaAs drain layer (drain) 3 are epitaxially grown upon the n-GaAs substrate (source) 1, and the p-GaAs gate layer 4 is formed by diffusion or ion implantation, or these layers may be selectively grown epitaxially in sequence.

Figure 5:
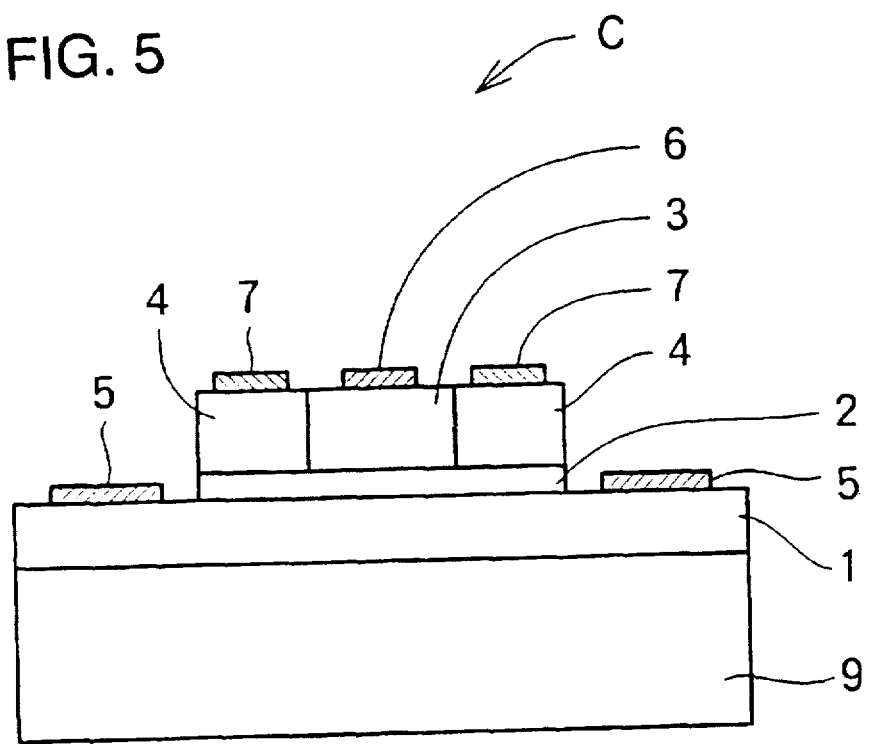
FIG. 5 is a schematic sectional view showing a semiconductor device according to a third embodiment of this invention.
Figure 6:
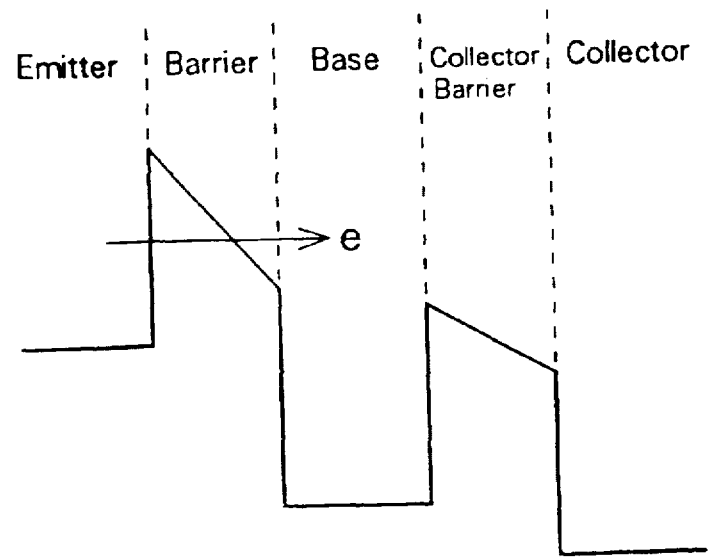
FIG. 6 is a diagram used to explain the principles of operation of a hot electron transistor formed of a semiconductor heterojunction.

As in the case of a semiconductor device C shown in FIG. 5, the aforementioned layers 1, 2, 3, and 4 may be epitaxially grown upon a GaAs semi-insulation substrate 9. In this case, device electrodes 5, 6, and 7 are all formed on the surface side.

As described above, in the semiconductor device according to the present invention, the barrier layer has been formed on the first semiconductor layer (source), and the second semiconductor layer (drain) and the gate layer adjacent to the second semiconductor layer (drain) have been formed on the barrier layer. Therefore, if the second semiconductor layer (drain) is biased to a plus voltage with the first semiconductor (source), then the tunneling current will flow by way of the barrier layer. By applying a voltage to the gate layer so that the p-n junction is biased in the reverse direction, the potential on the gate side of the channel rises and the tunneling current decreases. Also, the channel width decreases due to the spread of the depletion layer to the channel side, and consequently, the current of the second semiconductor layer decreases. Thus, based on the voltage applied to the gate layer, the current, which flows from the first semiconductor layer to the second semiconductor layer, can be controlled.

Since hot electrons (tunneling current) are utilized, a high-speed operation is possible. Also, since, unlike the HET, there is no reflection at a collector barrier, a current amplification factor can be increased. In addition, since the device (semiconductor device) is structurally simple, formation of a contact (electrode) is easy.

While the invention has been described with reference to specific embodiments thereof, it will be appreciated by those skilled in the art that numerous variations, modifications, and embodiments are possible, and accordingly, all such variations, modifications, and embodiments are to be regarded as being within the scope of the invention.

What is claimed is:

1. A semiconductor device comprising:

a first semiconductor layer;

a barrier layer provided on said first semiconductor layer and including opposing first and second surfaces, said first semiconductor layer abutting said first surface;

a second semiconductor layer abutting said second surface of said barrier layer; and a gate layer abutting said second surface of said barrier layer adjacent to said second semiconductor layer, said gate layer and said second semiconductor layer defining a pn junction for controlling a tunneling current across said barrier layer.

2. A semiconductor device as in claim 1, wherein one of said first and second semiconductor layers comprises an n-type semiconductor and the other one of said first and second semiconductor layers comprises a p-type semiconductor.

3. The semiconductor device of claim 1, further comprising a source electrode abutting said first semiconductor layer.

4. The semiconductor device of claim 3, further comprising a drain electrode abutting said second semiconductor layer.

5. The semiconductor device of claim 4, further comprising a gate electrode abutting said gate layer.

6. A semiconductor device comprising:

a first semiconductor layer;

a barrier layer provided on said first semiconductor layer;

a second semiconductor layer provided on said barrier layer opposite said first semiconductor layer;

a gate insulation layer abutting said barrier layer opposite said first semiconductor layer and abutting a side surface of said second semiconductor layer; and a gate electrode abutting said gate insulation layer;

wherein one of the first and second semiconductor layers comprises an n-type semiconductor and the other one of the first and second semiconductor layers comprises a p-type semiconductor.

7. A semiconductor device as in claim 6, further comprising an electrode abutting said first semiconductor layer opposite said tunneling barrier.

8. A semiconductor device as in claim 6, wherein said second semiconductor layer and said gate insulation layer define a pn junction for controlling a tunneling current between said first and second semiconductor layers.

9. A semiconductor device comprising:

a first semiconductor layer composed of n-GaAs having a first surface;

a barrier layer comprising a tunnel barrier wall abutting said first surface of said first semiconductor layer, and being composed of AlAs and said barrier layer having an upper surface opposite said first surface of said first semiconductor layer;

a second semiconductor layer forming a drain and composed of n-GaAs abutting said upper surface of said barrier layer; and a gate layer composed of p-GaAs abutting said upper surface of said barrier layer and abutting said second semiconductor layer providing a pn junction.

10. A semiconductor device as in claim 9 wherein said second semiconductor layer extends upwardly from said upper surface of said barrier layer and has a side surface, and further including a gate insulation layer disposed on said side surface, and a gate electrode disposed on said gate insulation layer, and a source electrode disposed on another side of said first semiconductor layer.

11. A semiconductor device as in claim 9 further including a gate electrode disposed on said gate layer, and a source electrode provided on a second surface of said first semiconductor layer.

* * * * *

UNITED STATES PATENT AND TRADEMARK OFFICE
CERTIFICATE OF CORRECTION

PATENT NO. : 5,895,931
DATED : April 20, 1999
INVENTOR(S) : Nobuhiro Sakurai

It is certified that error appears in the above-identified patent and that said Letters Patent is hereby corrected as shown below:

Column 1, line 4, change "1997" to -- 1995 --.

Column 1, line 44, change "HET" to -- HET's --.

Column 3, line 49, change "825" to -- 835 --.
Column 3, line 10, change "(I" to --i--.

Signed and Sealed this

Fourteenth Day of March, 2000

Attest:

Q. TODD DICKINSON

Attesting Officer

Commissioner of Patents and Trademarks

UNITED STATES PATENT AND TRADEMARK OFFICE
CERTIFICATE OF CORRECTION

PATENT : 5,895,931
DATED : April 20, 1999
INVENTOR(S) : Nobuhiro Sakuri

It is certified that error appears in the above-identified patent and that said Letters Patent is hereby corrected as shown below:

Column 1, line 4, change "1997" to --1995--.
Column 1, line 44, change "HET" to --HET's--.
Column 1 line 49, change "825" to --835--.
Column 3, line 10, change "(Indicated" to --(indicated--.

This certificate supersedes the Certificate of Correction issued March 14, 2000.

Signed and Sealed this

Tenth Day of April, 2001

*Attest:*

NICHOLAS P. GODICI

*Attesting Officer*    *Acting Director of the United States Patent and Trademark Office*